（12）United States Patent
Nemoto et al.

(10) Patent No.: US 8,053,149 B2
(45) Date of Patent: Nov. 8, 2011

(54) METHOD FOR PRODUCING COLOR FILTER FOR IMAGE SENSOR

(75) Inventors: Yoichi Nemoto, Shizuoka (JP); Nobushige Sasaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1067 days.

(21) Appl. No.: 10/579,979

(22) PCT Filed: Nov. 19, 2004

(86) PCT No.: PCT/JP2004/017304
§ 371 (c)(1),
(2), (4) Date: Dec. 12, 2006

(87) PCT Pub. No.: WO2005/050268
PCT Pub. Date: Jun. 2, 2005

(65) Prior Publication Data
US 2007/0099094 A1 May 3, 2007

(30) Foreign Application Priority Data

Nov. 21, 2003 (JP) ................ 2003-392148
Jun. 23, 2004 (JP) ................ 2004-185492

(51) Int. Cl.
*G02B 5/20* (2006.01)
*G03F 7/00* (2006.01)

(52) U.S. Cl. .......................................... 430/7; 430/330
(58) Field of Classification Search .................. None
See application file for complete search history.

(56) References Cited

FOREIGN PATENT DOCUMENTS

| JP | 10-90515 A | 4/1998 |
|---|---|---|
| JP | 10-339959 | 12/1998 |
| JP | 11-23829 A | 1/1999 |
| JP | 2001-249213 A | 9/2001 |
| JP | 2002-107534 | 4/2002 |
| JP | 2003-121627 A | 4/2003 |
| JP | 2003-131378 | 5/2003 |
| JP | 2003-295432 | 10/2003 |
| JP | 2003-313217 | 11/2003 |
| JP | 2003-330186 A | 11/2003 |
| JP | 2005-172923 | 6/2005 |

*Primary Examiner* — John A. McPherson
(74) *Attorney, Agent, or Firm* — Sughrue Mion, PLLC

(57) ABSTRACT

A method for producing a color filter for an image sensor capable of obtaining pixels each constituted substantially into a rectangular shape and having a favorable cross-sectional pattern profile and capable of effectively preventing the deformation of a dye-containing pixel even in a case of conducting post-baking or the like, the production method comprising the processes of coating a dye-containing photo-curable composition on a substrate directly or by way of another layer, then drying to form a coating film, exposing the coating film, putting the exposed coating film to alkali development and irradiating a Ultraviolet radiation to alkali-developed coating film while heating at 20 to 50° C.

8 Claims, 1 Drawing Sheet

METHOD FOR PRODUCING COLOR FILTER FOR IMAGE SENSOR

BACKGROUND OF THE INVENTION

1. Field of the Invention

The present invention concerns a method for producing a color filter for an image sensor suitable to formation of colored images of a highly fine color filter used in an image sensor (CCD, CMOS, etc).

2. Technical Background

As a method of producing a color filter for use in an image sensor, a dyeing method, a printing method, an electrodeposition method and a pigment dispersion method have been known. Among them, the pigment dispersion method is a method of using a colored radiation-ray sensitive composition in which a pigment is dispersed in various photosensitive compositions and producing color filters by a photolithographic process, and since the pigment is used, the obtained coating film is stable to light, heat or the like. Then, since patterning is conducted by the photolithographic process, the positional accuracy is high and it is used generally as a method suitable to production of a color filter for use in large screen and highly fine color display.

In the production of the color filter by the pigment dispersion method, a ray-sensitive composition containing a pigment is coated and dried on a glass substrate or the like by a spin coater or a roll coater, to form a coating film and the coating film is exposed patternwise and further developed. Then, a heat treatment (post-baking) process is applied for improving the solvent resistance, development resistance and heat resistance of the resultant pattern images to promote hardening of the coating film thereby obtaining permanent coating films of high durability. By way of the processes described above, the processes after the second color can be conducted stably as much as possible and a color filter can be obtained by repeating the operation for several times in accordance with a desired number of hues.

Then, in a case of producing a color filter for use in a liquid crystal display device, a light shielding layer referred to as a black matrix is usually disposed with an aim of improving the contrast for shielding light between each of color pixels. Accordingly, a pattern of a forward taper is usually formed as a pattern profile for each of the pixels in order that a gap is not formed between each of the pixels and the black matrix.

On the contrary, in a case of a color filter for use in an image sensor, since highly fineness and high density with the length for one side of a pixel being 5 μm or less is desired, it is necessary to make each of the pixels independent without providing the black matrix or the like. However, since each of the pixels is made independent, disadvantage often occurs upon forming each of the pixel to result in a problem that a pixel with a rectangular profile for the pattern cross section can not be obtained. The disadvantage includes occurrence of "tailing" in which pattern images are deformed in the direction of increasing the contact area with the substrate, or "thermal flow" in which corners of a pixel are rounded upon conducting the post-baking. The tailing or thermal flow is a minutes deformation of the pattern which gives no problem in existent large pixels but entails decrease of the film thickness or color mixing since the inter-pixel distance is shortened in a small pixel and each of the pixels can not be constituted with a desired color. Particularly, in a color filter for use in an image sensor requiring highly fineness, the pattern profile for each pixel is one of important factors.

Further, in a case of the pigment dispersion type described above, since the grain size of the pigment is large to scatter the Ultraviolet radiation upon exposure, the resolution power is not improved and, accordingly, this imposes a limit on coping with the requirement of higher fineness. Further, since the grain size of the pigment has a distribution, it is difficult to form a uniform pixel with no color shading and it has a limit for the application use of the image sensor that requires a fine pattern. As a technique for overcoming the problems described above, JP-A No. 6-75375 described an example of using a dye thereby improving the resolution power and making the color distribution in the pixel uniform.

For the method of using the dye, a dying method of forming pattern images on a substrate by using a photosensitive composition containing a dye and subsequently dyeing the thus formed pattern images. However, the dyeing method involves a problem that it is difficult to control the degree of dyeing and the processes are complicated compared with other methods. Accordingly, as means for overcoming the drawbacks of the dyeing method and the pigment dispersion method, a method of producing a color filter for an image sensor by using a photosensitive composition containing a dissolved dye has been studied.

Particularly, in an application use for image sensors, it has been required to decrease the thickens of a color filter in view of a commercial demand of decreasing the size of image sensors and, specifically, it is required that the thickness is 1.5 μm or less. In order to maintain a sufficient chromaticity in a color filter for such a reduced film thickness, it is necessary to incorporate a great amount of a dye in a hardenable composition that forms a color filter (at least by 10% by mass or more in solid content). However, in a case where the content of the dye is increased excessively, since the ratio of the curable component is decreased relatively, the photo-curability of the composition, heat resistance after photo-curing, developability in a non-cured portion and the film thickness retention of the photo-cured portion are lowered. Then, they involve significant problems of resulting lowering of the film thickness retention in the photo-cured portion during the development process to lower the chromaticity, and further pattern deformation entailing 'tailing' or 'thermal flow' during post-baking to change the chromaticity.

Particularly, the problem of the pattern deformation during the post-baking is conspicuous in the dye system with a larger content compared with the pigment system. The pigment system color filter by the pigment dispersion method described above has high heat resistance for the entire photo-cured film due to the dispersion of the heat stable pigment in the cured film and can provide a pattern of less losing the shape due to "filler effect" thereby less resulting in the problem of the pattern deformation described above.

As described above, since the highly fineness is required in the color filter for use in the image sensor, a dye-containing curable composition has been studied. Particularly, for satisfying also the requirement for reducing the film thickness together with higher fineness, it is necessary that the dye is incorporated at a high concentration in the curable composition that forms the color filter. However, "filler effect" as in the pigment system can not be expected in a case of the dye system. Accordingly, the dye present at high concentration in the cured film results in deterioration of the film property and, as a result, entails tailing or thermal flow to worsen the pattern profile of the pixel.

In connection with the situations described above, JP-A No. 2000-19728 describes a technique of containing a 1,3,5-triazine derivative and N-phenyl glycins in combination in a photo initiator component as a technique of obtaining pixels with good pattern profile. However, since the method is directed to the pigment system, this can not improve the worsening of the pattern profile which may possibly occur in a case of the dye system.

Further, JP-A No. 11-153708 describes applying Ultraviolet radiation irradiation (together with heating) to a film after development by using a pigment type resist. However, this is also directed to the pigment system and does not intend to ensure the resist shape as an object of post-baking but intend to prevent thermal decomposition of an underlying flattening film during the post-baking. Further, application of Ultraviolet radiation irradiation together with post-baking by using the pigment system composition has been also be known, for example, in JP-A No. 10-339959; This method is also directed to the pigment system in which Ultraviolet radiation irradiation is also conducted in addition to a drying treatment (post-baking) with an aim of preventing color contamination at or after the second color. Further, a technique of applying Ultraviolet radiation irradiation together with heating to a positive type resist film has also been known, for example, in JP-A No. 10-261571. In a case of the positive type resist, heating and UV light irradiation are further conducted to a non-irradiation region upon pattern formation, that is, to a not yet reacted region. None of them concerns the dye system. Accordingly, it does not intend to overcome the worsening of the pattern profile which comes into question when constituted as a dye system that requires a great amount of the dye as described above and discloses nothing about the pattern profile.

Further, a method for producing a solid image device by using a dye system photosensitive composition is also disclosed in JP No. 3309514. In this method, the photo-curing temperature is elevated to 60 to 200° C. and elevation to the temperature is conducted gradually thereby intending to promote curing while avoiding the heat deformation by rapid heating in a case of applying heating together with light for improving the photo-curing efficiency with a view point of merely preventing deformation by heating. However, in a case of the application use for the image sensor constituted with a fine pattern, even gradual temperature elevation within the temperature range described above is still insufficient to completely avoid deformation caused by the tailing or thermal flow of the pattern.

In addition to those described above, it has also been proposed to improve the heat resistance or the like by using a photosensitive polymer compound introduced with a photosensitive vinyl group by way of an isocyanate group as described in JP-A No. 6-230212, or improve the heat resistance of pattern after curing by using an acrylic resin with addition of an unsaturated carboxylic acid to a polymer comprising a monomer having an epoxy group and an unsaturated double bond as described in JP-A No. 9-106072. However, since the alkali soluble resin has no double bond in the former, the pattern profile has not yet been improved so as to be suitable to an image sensor requiring high fineness and high density. Further, since heat curing is conducted above 200° C. in the latter, discoloration of a dye may possibly occur in a case of using a dye sensible to heat.

[patent document 1] JP-A No. 6-75375

[patent document 2] JP-A No. 2000-19728

[patent document 3] JP-A No. 11-153708

[patent document 4] JP-A No. 10-339959

[patent document 5] JP-A No. 10-26157

[patent document 6] JP No. 3309514

[patent document 7] JP-A No. 6-230212

[patent document 8] JP-A No. 9-106072

DISCLOSURE OF INVENTION

As described above, any of the prior arts concerns the pigment system or production of semiconductors (positive resist). Further, while the technique concerning the dye system was proposed, a technique capable of forming a good pattern and capable of effectively improving the deformation (rounding, tailing etc.) with thermal flow or worsening of the pattern profile also in a case of applying post-baking has not been established, particularly, for the production of a color filter for use in image sensors constituted into a highly fine rectangular shape by using the dye.

The present invention intends to provide a method for producing a color filter for an image sensor capable of obtaining a pixel constituted into a substantially rectangular shape, having a favorable cross sectional pattern profile, and capable of effectively preventing deformation caused by thermal flow in a dye-containing pixel even in a case of applying a heat treatment such as post-baking.

The present invention has the following means for overcoming the subjects described above.

<1> A method for producing a color filter for an image sensor comprising:

coating a photo-curable composition containing a dye, an alkali soluble resin, a polymerizable monomer and a photo initiator on a substrate directly or with another layer therebetween and then drying the same to form a coating film, exposing a predetermined pattern on the coating film, developing the exposed coating film with a liquid alkali developer, and irradiating the developed coating film with ultraviolet radiation while heating at a temperature of 20° C. to 50° C.

<2> The method for producing the color filter for an image sensor according to <1>, further comprising heating the coating film which has been irradiated with ultraviolet radiation at 100° C. to 300° C.

<3> The method for producing the color filter for an image sensor according to <1> or <2>, wherein a pixel pattern having a thickness of 3 μm or less and a pixel size of 5 μm or less is formed.

<4> The method for producing the color filter for an image sensor according to at least one of <1> to <3>, wherein, during irradiating with ultraviolet radiation, ultraviolet radiation is irradiated on the developed coating film under heating at 25° C. to 40° C.

<5> The method for producing the color filter for an image sensor according to at least one of <1> to <4>, wherein, during irradiating with ultraviolet radiation, the wavelength of the Ultraviolet radiation is from 200 to 300 nm.

<6> The method for producing the color filter for an image sensor according to at least one of <1> to <5>, wherein, during irradiating with ultraviolet radiation, the irradiation time of the ultraviolet radiation is from 10 to 180 sec.

<7> The method for producing the color filter for an image sensor according to at least one of <1> to <6>, wherein the alkali soluble resin contains a molecular chain having a polymerizable double bond in the molecule.

<8> The method for producing the color filter for an image sensor according to at least one of <1> to <7>, wherein the alkali soluble resin contains a molecular chain that is present on a side chain and the molecular chain has at least one member selected from an acryloyl group, a methacryloyl group, and an allyl group.

<9> The method for producing a color filter for an image sensor according to at least one of <1> to <6>, wherein the alkali soluble resin is a resin having at least one of the (meth) acryloyl groups represented by the following formula (1-1) to formula (1-3):

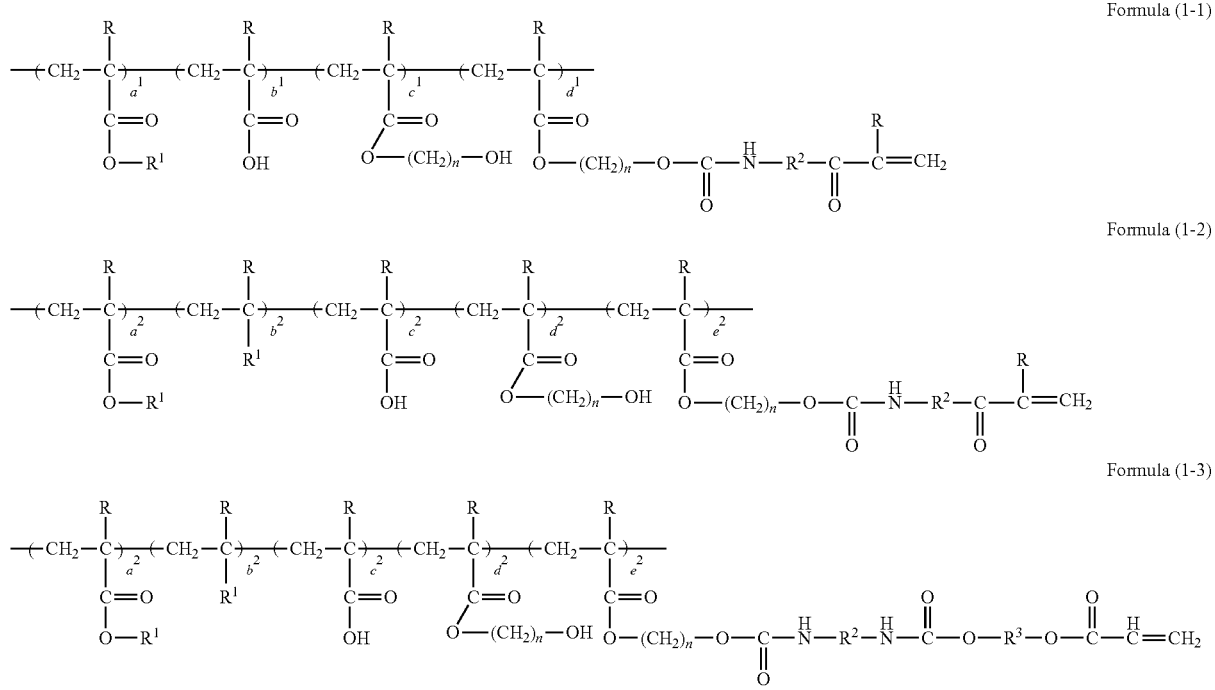

Formula (1-1)

Formula (1-2)

Formula (1-3)

wherein R represents a hydrogen atom or a methyl group, $R^1$ represents an alkyl group having 1 to 18 carbon atoms, a phenyl group having an alkyl group having 1 to 4 carbon atoms or an alkoxy group having 1 to 4 carbon atoms, an aryl group having 6 to 12 carbon atoms, or an aralkyl group having 7 to 12 carbon atoms, $R^2$ represents an alkylene group having 1 to 18 carbon atoms, a phenylcarbamate ester group having an alkyl group having 1 to 4 carbon atoms, or a carbamate ester group having a cycloaliphatic group having 3 to 18 carbon atoms, $R^3$ represents a linear or branched alkylene group having 2 to 16 carbon atoms; $a^1$ to $d^1$ in formula (1-1), $a^2$ to $e^2$ in formula (1-2), and $a^2$ to $e^2$ in formula (1-3) each represent a molar ratio (mol %) of repetitive units contained; $b^1$ represents from 3 to 50, $c^1$ represents from 3 to 40, $d^1$ represents from 2 to 60, and they satisfy: $a^1+b^1+c^1+d^1=100$ in formula (1-1), and $b^2$ represents from 9 to 85, $c^2$ represents from 3 to 50, $d^2$ represents from 3 to 40, $e^2$ represents from 2 to 60, and they satisfy: $a^2+b^2+c^2+d^2+e^2=100$ in formulae (1-2) and (1-3), and n represents from 2 to 16.

The present invention can provide to a method for producing a color filter for an image sensor capable of obtaining a pixel constituted into a substantially rectangular shape, having a favorable cross sectional pattern profile, and capable of effectively preventing deformation caused by thermal flow in a dye-containing pixel even in a case of applying a heat treatment such as post-baking.

CARRYING OUT THE INVENTION

Figure 1:
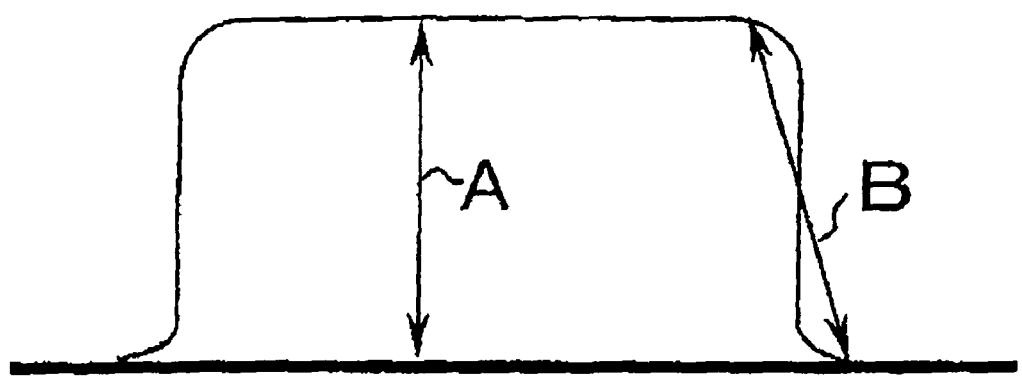
FIG. 1 is a view for explaining the thickness of a pattern and the length from a planer surface end at an upper portion of a pattern to the bottom end thereof used for the evaluation of the pattern profile.

A method for producing a color filter for an image sensor according to the invention has a feature in using a composition containing a dye as a coloring agent, and conducting a photo-curing treatment of irradiating a Ultraviolet radiation to the coating film after the development while heating in a temperature region from 20° C. to 50° C. (hereinafter referred to as "post-cure"), after developing the composition (after development and before post-baking in a case of applying post-baking).

A method for producing a filter for an image sensor according to the invention is to be described specifically.

A method for producing the color filter for the image sensor according to the invention comprises the processes of coating a photo-curable composition according to the invention to be described later on a substrate directly or with another layer therebetween and then drying the same (pre-baking) to form a coating film (hereinafter also referred to as "coating layer formation process"), developing the exposed coating film with a liquid alkali developer (hereinafter also referred to as "development process") and irradiating a Ultraviolet radiation to the developed coating film while heating at 20° C. to 50° C. (hereinafter also referred to as "Post-cure process"). By way of the processes described above, it is possible to produce a color filter for an image sensor provided with a pixel pattern colored with a dye and having a favorable rectangular pattern concentration being adjusted, preferably, to pH 11 to 13 and, more preferably, to pH 11.5 to 12.5. In a case where the alkali concentration exceeds pH 13, it may sometimes cause roughing or peeling of the pattern and lowering of the film thickness retention. In a case where pH is less than 11, this may sometimes retard the developing rate or result in occurrence of residues. In this process, development can be conducted suitably by using a liquid developer comprising the aqueous alkali solution as described above. The developing method includes, for example, a dipping method, a spraying method or a paddle method, and the developing temperature is preferably from 15 to 40° C. Further, after development, washing is conducted generally with running water.

Then, in the invention, a Post-cure process for conducting Post-curing by irradiating a Ultraviolet radiation while heating at 20° C. to 50° C. to the developed coating film is further provided after the development process (after the development process and before the post-baking in a case of applying post-baking). In the Post-cure process, it is possible to effectively prevent deformation caused by thermal flow or tailing in the coating film constituted by using the dye (that is a film finally constituting the pixel) by Post-curing pattern images after development or previously applying Post-curing before post-baking in a case of applying the post-baking, and profile. Further, depending on the case, a post-baking may further be conducted after the Post-cure process.

In the coating layer formation process, the photo-curable composition according to the invention is coated on a substrate by using a coating method such as rotary coating, cast coating, roll coating or slit coating, and further dried to form a radiation ray sensitive composition film (coated film). The coating can be conducted on the substrate directly or by way of another layer.

The substrate is not limited particularly in the application for the image sensor according to the invention and, includes, a photoelectronic conversion substrate such as made of silicon, and a complimentary metal oxide film semiconductor (CMOS). Further, an antireflection film may also be disposed on the substrate.

Further, an undercoat layer may also be formed optionally on the substrate with an aim of improving close adhesion with an upper layer, preventing diffusion of the material or planarization of the substrates surface.

In the exposure process, a predetermined pattern is exposed to the coating film formed in the coating layer formation process, for example, by way of a mask. As the radiation ray used upon exposure, UV light such as g-ray, h-ray or i-ray can be used particularly preferably.

The development process is a process of developing the exposed coating film with a liquid alkali developer. As the liquid alkali developer, any of those capable of dissolving the photo-curable composition according to the invention and not dissolving the exposed portion (radiation ray irradiated portion) can be used. Specifically, various organic solvents and combinations thereof or aqueous alkaline solutions can be used.

The organic solvent described above includes those solvents to be described later that can be used upon preparing the photo-curable composition according to the invention. Further, the aqueous alkaline solution include, for example, aqueous solutions containing, for example, sodium hydroxide, potassiumhydroxide, sodium carbonate, sodium silicate, sodium metasilicate, aqueous ammonia, ethylamine, diethylamine, dimethyl ethanolamine, tetramethyl ammonium hydroxide, tetraethyl ammonium hydroxide, choline, pyrrole, piperidine, and 1,8-diazabicyclo-[5.4.0]-7-undecene.

The liquid alkali developer used in the invention is, preferably, an aqueous alkali solution with the alkali a pixel having a substantially rectangular shape and having a favorable pattern profile of a rectangular cross section can be formed while not always requiring heating. This is effective particularly for a fine pixel in that the pattern profile thereof can be kept.

The Post-curing in the invention is conducted by irradiating an Ultraviolet radiation in a state of heating in a region at a relatively low temperature (low temperature region) at 25° C. to 50° C. (preferably, 25° C. to 40° C.). That is, for maintaining a pattern profile for a small pixel, it is necessary to suppress the upper limit of the temperature in the pixel forming process and a certain level of temperature is required for promoting curing and the temperature can be ensured. The wavelength of the Ultraviolet radiation is suitably from 200 to 300 nm while depending on the absorption wavelength inherent to the photo initiator contained in the photo-curable composition. As the light source for the Ultraviolet radiation, for example, a high pressure mercury lamp, low pressure mercury lamp or the like can be used. The irradiation time is from 10 to 180 sec, preferably, 20 to 120 seconds and, more preferably, 30 to 60 sec.

In a case where post cure is conducted under heating, generally, this is effective for the promotion of the post cure but, on the other hand, the pattern profile tends to be deteriorated by heat. Since the heating in the invention is conducted within the low temperature region as described above, the pattern profile is not deteriorated even in a case where it is constituted finely for an image sensor using the dye. Further, in a case where the molecule of the alkali soluble resin contained in the photo-curable composition contains a molecular chain having a polymerizable double bond (molecular chain having preferably at least one of acryloyl group, methacryloyl group and allyl group), the post cure can be promoted effectively and this is useful in that the Ultraviolet radiation irradiation time can be shortened or the heat treatment to the coating film after development can be conducted at lower temperature.

Accordingly, upon conducting post cure in the invention, the pattern profile tends to be lost under the condition where the temperature exceeds 50° C. particularly in a case where the pixel is small and, on the other hand, no sufficient curing can be expected even by the use of an alkali soluble resin having a double bond under the condition of lower than 20° C., which is not preferred.

Further, after the irradiation of the Ultraviolet radiation, that is, after the Post-cure process, a process of applying a heat treatment (post-baking) can be disposed (post-baking process) optionally with an aim of sufficiently curing the coating film after the post cure. Further, the heating temperature in this process is, preferably, from 100 to 300° C., more preferably, from 150 to 250° C. Further, the heating time is, preferably, about from 10 minutes to 1 hour and, more preferably, about from 5 minutes to 30 min.

In the existent color filter production, the post-baking process described above is an essential process for providing the durability of the pixel but the post-baking process is not always necessary in the invention. Further, when the post cure is applied, loss of the pixel shape can be substantially avoided even in a case of applying post-baking at a temperature of 100° C. or higher.

The method for producing the color filter for use in the image sensor according to the invention is particularly suitable in a case of forming a pixel pattern with a thickness of 3 µm or less (preferably, 2 µm or less, most preferably, 1.5 µm or less) and with a pixel size [that is, the size of a pixel (minimum element of an image that can be treated independently on a display] is 5 µm or less (preferably, 3 µm or less). That is, in the case of constituting to a minutes size by using the dye, this is particularly effective in the invention since deformation with thermal flow or tailing during heating tends to cause deformation.

The thickness means a height of a pixel provided on a substrate substantial parallel with the normal line direction of the substrate and the pixel size (size of pixel) means a maximum width at the surface of arrangement for each of the arranged pixels (display surface) which is, for example, a length of a diagonal line in a case where the pixel has a square or rectangular shape.

In the method for producing the color filter for use in the image sensor according to the invention, a photo-curable composition comprising at least a dye, an alkali soluble resin, a polymerizable monomer and a photo initiator is used. The photo-curable composition can be constituted generally by further using a solvent and, if necessary, can be constituted by using other component such as an additive.

[Dye]

The photo-curable composition according to the invention contains at least one kind of dye, The dye usable in the invention is not limited particularly and can be used being properly selected from dyes known so far (particularly for color filter use).

Specific examples include those dyes described in JP-A Nos. 64-90403, 64-91102, 1-94301, 6-11614, JP No. 2592207, U.S. Pat. Nos. 4,808,501, 5,667,920, 5,059,500, JP-A Nos. 5-333207, 6-35183, 6-51115, 6-194828, 8-211599, 4-249549, 10-123316, 11-302283, 7-286107, 2001-4823, 8-15522, 8-29771, 8-146215, 11-343437, 8-62416, 2002-14220, 2002-14221, 2002-14222, 2002-14223, 8-302224, 8-73758, 8-179120, and 8-151531.

As the chemical structure, dyes such as of pyrazole azo, anilino azo, triphenylmethane, anthraquinone, anthrapyridone, benzilidene, oxonol, pyrazolotriazole azo, pyridone azo, cyanine, phenothiazine, pyrrolo pyrazole azomethine, xanthene, phthalocyanine, benzopyran, and indigo series dyes are preferably used.

In a case where it is constituted as a resist system for conducting alkali development, acidic dyes and/or derivatives thereof can be suitably used in view of completely removing the binder and/or the dye by the development. In addition, direct dyes, basic dyes, mordant dyes, acidic mordant dyes, azoic dyes, disperse dyes, oil soluble dyes, food dyes and/or derivatives thereof are useful. The acidic dyes are to be explained below.

—Acidic Dye—

The acidic dye is not particularly restricted so long as it has an acidic group such as a sulfonic group or carboxylic group, but it is preferably selected while considering all the required characteristics such as a solubility to an organic solvent or developer, a salt-forming property with a basic compound, light absorbency, interaction with other components in the photo-curable composition, light fastness, heat resistance, etc.

Specific examples of the acidic dye are to be described below. However, they not limitative in the invention.

acid alizarin violet N;
acid black 1, 2, 24, 48;
acid blue 1, 7, 9, 15, 18, 23, 25, 27, 29, 40, 45, 62, 70, 74, 80, 83, 86, 87, 90, 92, 103, 112, 113, 120, 129, 138, 147, 158, 171, 182, 192, 243, 324:1;
acid chrome violet K;
acid Fuchsin;
acid green 1, 3, 5, 9, 16, 25, 27, 50;
acid orange 6, 7, 8, 10, 12, 50, 51, 52, 56, 63, 74, 95,
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, 274;
acid violet 6B, 7, 9, 17, 19;
acid yellow 1, 3, 7, 9, 11, 17, 23, 25, 29, 34, 36, 42, 54, 72, 73, 76, 79, 98, 99, 111, 112, 114, 116, 184, 243;
Food Yellow 3;
and derivatives of such dyes.

Among those described above, dyes such as acid black 24; acid blue 23, 25, 29, 62, 80, 86, 87, 92, 138, 158, 182, 243, 324:1, acid orange 8, 51, 56, 74, 63, 74; acid red 1, 4, 8, 34, 37, 42, 52, 57, 80, 97, 114, 143, 145, 151, 183, 217, acid violet 7; acid yellow 17, 25, 29, 34, 42, 72, 76, 99, 111, 112, 114, 116, 184, 243; Acid Green 25; and derivative of such dyes are preferred.

Further, other acidic dyes than those described above such as of azo, xantene, and phthalocyanine series are also preferred, and acidic dyes such as C.I. Solvent Blue 44, 38, C.I. solvent Orange 45, Rhodamine B, Rhodamine 110, 2,7-Naphthalene disulfonic acid, 3-[(5-chloro-2-phenoxyphenyl) hydroazono]-3,4-dihydro-4-oxo-5-[(phenylsulfonyl) amino]-, and derivatives of such dyes can also be used preferably.

The content of the dye in the photo-curable composition according to the invention is, preferably, from 5 to 70% by mass, more preferably, from 10 to 65% by mass based on the solid content of the composition, and further, particularly preferably, from 20 to 60% by mass in view of the balance of the density of the pixels and the rectangularity of the cross section thereof.

[Alkali Soluble Resin]

The photo-curable composition according to the invention contains at least one alkali soluble resin. It is preferred that the alkali soluble resin has an acidic functional group having an alkali developability such as a carboxyl group and a phenolic hydroxyl group and that the alkali soluble resin has an acidic value within a range of from 100 to 250 mgKOH/g.

As specific examples, linear organic high molecular polymers which are soluble in an organic solvent and developable with an aqueous weak alkaline solution are preferred. Such linear organic high molecular polymers can include polymers having carboxylic acids on the side chains, for example, methacrylic acid copolymer, acrylic acid copolymer, itaconic acid copolymer, crotonic acid copolymer, maleic acid copolymer, and partially esterified maleic acid copolymer as described in each of JP-A No. 59-44615, JP-B Nos. 54-34327, 58-12577, and 54-25957, JP-A Nos. 59-53836 and 59-71048. Further, acidic cellulose derivatives having carboxylic acids on the side chains are also useful. In addition, those in which an acid anhydride is added to a polymer having hydroxyl groups, polyhydroxystyrene resin, polysiloxane resin, poly(2-hydroxyethyl(meth)acrylate), polyvinyl pyrrolidone, polyethylene oxide, and polyvinyl alcohol are also useful.

The alkali soluble resin may be copolymerized with a monomer having a hydrophilic group, and the monomer includes, for example, hydroxyalkyl(meth)acrylate, glycerol (meth)acrylate, (meth)acrylamide, N-methylol acrylamide, secondary or tertiary alkylacrylamide, dialkylaminoalkyl (meth)acrylate, morpholine(meth)acrylate, N-vinylpyrrolidone, N-vinyl caprolactam, vinylimidazole, vinyltriazole, methyl(meth)acrylate, ethyl(meth)acrylate, branched or linear propyl(meth)acrylate, branched or linear butyl(meth) acrylate, and phenoxyhydroxypropyl (meth)acryalate.

As other hydrophilic monomers, monomers containing tetrahydrofurfuryl group, phosphoric acid, phosphate ester, quaternary ammonium salt, ethyleneoxy chain, propyleneoxy chain, sulfonic acid and salt thereof and morpholinoethyl group are also useful.

In the invention, those comprising a high molecular weight polymer containing a molecular chain having a polymerizable double bond (ethylenically unsaturated group) in the molecule are particularly preferred. The high molecular weight polymer containing the molecular chain having the polymerizable double bond in the molecule can be used so long as the polymer is alkali soluble and has a polymerizable double bond such as an ethylenically unsaturated bond and, for example, can include a polymer having an ethylenically unsaturated bond.

In this case, the ratio of the "high molecular weight polymer containing the molecular chain having the polymerizable double bond in the molecule" is preferably 10% by mass, more preferably, 20% by mass, particularly preferably 30% by mass based on the total amount of the alkali soluble resin. In a case where the ratio is less than 10% by mass, the pattern profile of the pixel is sometimes distorted from the rectangular shape. Further, the amount of the double bond present in the alkali soluble resin is preferably from 1 to 5 mmol/g, more preferably, from 1 to 4.5 mmol/g, further preferably, from 1.5 to 4.0 mmol/g, when expressed by a mmol amount in 1 g of the resin.

Examples of the polymer having the ethylenically unsaturated group are to be described. However, they are not restricted to those shown below so long as they contain carbon-carbon unsaturated bond.

As the polymer having the ethylenically unsaturated group, a compound obtained by reacting a copolymer of monomers having an OH group, for example, 2-hydroxyethyl acrylate, having a COOH group, for example, methacrylic acid, and acrylic or vinylic compound copolymerizable with them, with a compound having an epoxy ring reactive with an OH group and a carbon-carbon unsaturated bond group (for example, compound such as glycidyl acrylate) can be used.

group can include DIANAL NR series (manufactured by Mitsubishi Rayon Co. Ltd.), Photomer 6173 (COOH-containing Polyurethane acrylic oligomer, manufactured by Diamond Shamrock Co. Ltd.), BISCOAT R-264, KS RESIST 106 (both manufactured by Osaka Organic Chemical Industry Co. Ltd.), CYCLOMER-P series, PLACSELL CF 200 series (both manufactured by Daicel Chemical Industry Co. Ltd.), and Ebecry 13800 (manufactured by Daicel UCB Co. Ltd.).

Among them, high molecular weight polymers having at least one member selected from the group consisting of crotonyl group, acryl group, methacryl group, acryloyl group, methacryloyl group, allyl group, propyl ester group, vinyl ester group and allyoxyalkyl group on the side chains are useful, and high molecular weight polymers containing a molecular chain having at least one member selected from the group consisting of acryl group, methacryl group, acryloyl group, methacryloyl group and allyl group on the side chains are useful and, especially, high molecular weight polymers containing a molecular chain having at least one member selected from the group consisting of acryloyl group, methacryloyl group and allyl group on the side chains are useful.

Among the alkali soluble resins, a resin having a (meth) acryloyl group represented by the following formula (1-1) to formula (1-3) as the molecular chain is preferred. (Meth) acryloyl represents acryloyl or methacryloyl.

Formula (1-1)

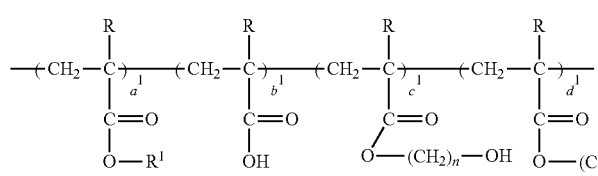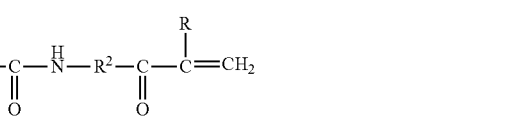

Formula (1-2)

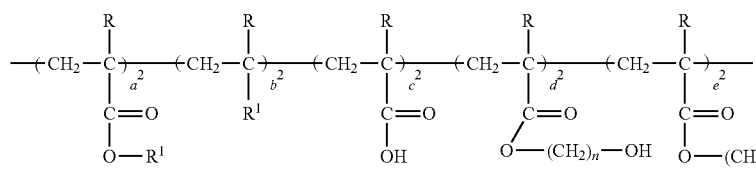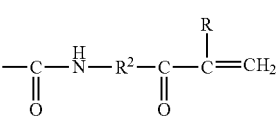

Formula (1-3)

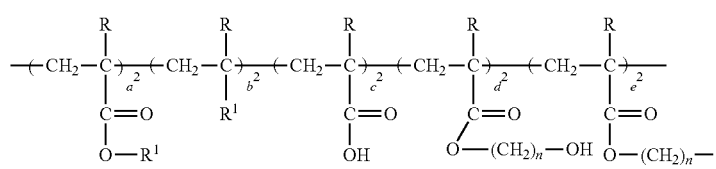

Those which are reactive with the OH group can include acid anhydride and compounds having an isocyanate group and having an acryloyl group in addition to the epoxy ring. Further, a reaction product obtained by reacting a compound obtained by reacting a compound having an epoxy ring and an unsaturated carboxylic acid such as an acrylic acid with a saturated or unsaturated polybasic acid anhydride as described in JP-A Nos. 6-102669 and 6-1938 can also be used. Examples of the compound having an alkali soluble group such as COOH and a carbon-carbon unsaturated bond In formulae (1-1) to (1-3), R represents a hydrogen atom or a methyl group, $R^1$ represents an alkyl group having 1 to 18 carbon atoms; a phenyl group having an alkyl group having 1 to 4 carbon atoms or an alkoxy group having 1 to 4 carbon atoms; an aryl group having 6 to 12 carbon atoms; or an aralkyl group having 7 to 12 carbon atoms, $R^2$ represents alkylene group having 1 to 18 carbon atoms; a phenyl carbamate ester group having an alkyl group having 1 to 4 carbon atoms; or a carbamate ester group having a cycloaliphatic group having 3 to 18 carbon atoms, $R^3$ represents a linear or branched alkylene group having 2 to 16 carbon atoms. $a^1$ to $d^1$ in formula (1-1), $a^2$ to $e^2$ in formula (1-2), and $a^2$ to $e^2$ in formula (1-3) each represents a molar ratio (mol %) of the repeating unit contained, in which $b^1$ represents from 3 to 50, $c^1$ represents from 3 to 40, $d^1$ represents 2 to 60, and they satisfy: $a^1+b^1+c^1+d^1=100$ in formula (1-1) and $b^2$ represents from 0 to 85, $c^2$ represents from 3 to 50, $d^2$ represents 3 to 40, $e^2$ represents from 2 to 60, and they satisfy: $a^2+b^2+c^2+e^2=100$ in formula (1-2) and (1-3), and n represents from 2 to 16.

Each of the groups will be explained specifically below.

In formulae (1-1) to (1-3), $R^1$ represents a alkyl group having 1 to 18 carbon atoms ($C_1$-$C_{18}$ alkyl group); a phenyl group having alkyl group having 1 to 4 carbon atoms ($C_1$-$C_4$ alkyl group) or alkoxy group having 1 to 4 carbon atoms ($C_1$-$C_4$ alkoxy group); a aryl group having 6 to 12 carbon atoms ($C_6$-$C_{12}$ aryl group); or a aralkyl group having 7 to 12 carbon atoms ($C_7$-$C_{12}$ aralkyl group). Hereinafter, the number of carbon atoms is abbreviated as "C".

The $C_1$-$C_{18}$ alkyl group represented by $R^1$ may be any of linear, branched or cyclic group, including, for example, methyl group, ethyl group, propyl group, butyl group, heptyl group, hexyl group, octyl group, decyl group, dodecyl group, hexadecyl group, octadecyl group, 2-chloroethyl group, 2-bromoethyl group, 2-cyanoethyl group, 2-methoxycarbonylethyl group, 2-methoxyethyl group, or 3-bromopropyl group.

The $C_1$-$C_4$ alkyl group of the phenyl group represented by $R^1$ can include, for example, an alkyl group having 1 to 4 carbon atoms among specific examples of $C_1$-$C_{18}$ alkyl groups. Further, the $C_1$-$C_4$ alkoxy group of the phenyl group can include, for example, methoxy group, ethoxy group, propoxy group or butoxy group.

The $C_6$-$C_{12}$ aryl group represented by $R^1$ can include, for example, a phenyl group, tolyl group, or naphthyl group.

The $C_7$-$C_{12}$ aralkyl group represented by $R^1$ can include, for example, a benzyl group, phenetyl group, 3-phenylpropyl group, naphthylmethyl group, 2-naphthyl ethyl group, chlorobenzyl group, bromobenzyl group, methylbenzyl group, ethylbenzyl group, methoxybenzyl group, dimethyl benzyl group, or dimethoxybenzyl group.

In formulae (1-1) to (1-3), $R^2$ represents a $C_1$-$C_{18}$ alkylene group, a phenylcarbamate ester group having a $C_1$-$C_4$ alkyl group or a carbamate ester group having a $C_3$-$C_{18}$ cycloaliphatic group.

The $C_1$-$C_{18}$ alkylene group represented by $R^2$ includes those of bivalent groups corresponding to the $C_1$-$C_{18}$ alkyl groups represented by $R^1$.

Specific examples of the $C_1$-$C_4$ alkyl group of the phenylcarbamate ester represented by $R^2$ can include those $C_1$-$C_{18}$ alkyl group represented by $R^1$ which have from 1 to 4 carbon atoms. The phenylcarbamate ester group has a structure represented by —OCO—NH—$C_6H_4$—, and the $C_1$-$C_4$ alkyl group is a substituent of the phenylene group therein.

The $C_3$-$C_{18}$ cycloaliphatic group of the carbamate ester group represented by $R^2$ includes, for example, cyclopentyl group, cyclobutyl group, cyclohexyl group, isophorone group, and dicyclohexyl group. The carbamate ester group has a structure represented by —NH—COO—, and the $C_3$-$C_{18}$ cycloaliphatic group forms a bivalent group together with the structure.

In formula (1-1) to (1-3), $R^3$ represents a linear or branched alkylene group having 2 to 16 carbon atoms. Specifically, those of bivalent groups corresponding to the $C_1$-$C_{18}$ alkyl group represented by $R^1$ having from 2 to 16 carbon atoms can be mentioned preferably.

$a^1$ to $d^1$ in formula (1-1), $a^2$ to $e^2$ in formula (1-2) and $a^2$ the $e^2$ in formula (1-3) each represents a molar ratio (mol %) of the repeating units contained.

With reference to $a^1$ to $d^1$ in formula (1-1), $b^1$ represents from 3 to 50, preferably from 5 to 40, $c^1$ represents from 3 to 40, preferably, from 10 to 30, $d^1$ represents from 2 to 60, preferably from 5 to 50, and they satisfy: $a^1+b^1+c^1+d^1=100$. Further, with reference to $a^2$ to $e^2$ in formula (1-2) and (1-3), $b^2$ represents from 0 to 85, preferably, from 0 to 80, $c^2$ represents from 3 to 50, preferably from 5 to 40, $d^2$ represents from 3 to 40, preferably, from 8 to 30, $e^2$ represents from 2 to 60, preferably, from 2 to 50, and they satisfy: $a^2+b^2+c^2+d^2+e^2=100$.

In formulae (1-1) to (1-3), n represents from 2 to 16, preferably, from 4 to 12.

Among formulae (1-1) to (1-3), a case in which $R^1$ represents an aralkyl group is preferred. More preferred is a case where $R^1$ represents a benzyl group, and $R^2$ represents an alkylene group having 2 to 16 carbon atoms or a residue of the diisocyalte described below from which (NCO) is removed. The diisocyanate can include, for example, diphenyl methane diisocyanate, tolylene diisocyanate, xylylene diisocyanate, 2,4-toluylene diisocayate, o-toluylene diisocyanate, isophorone diisocyanate, dicyclohexyl methane diisocyanate, and preferably, hexamethylene diisocyanate, isophorone diisocyanate, and tolylene diisocyanate. Further, $R^3$ preferably represents —$(CH_2)_n$— [n represents an integer of from 2 to 10], more preferably, —$(CH_2)_n$— [n represents an integer of from 2 to 6].

In addition to those described above, an alkali soluble resin having a polymerizable double bond represented by the following formula (I) as the molecular chain is also preferred.

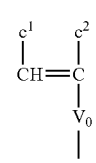

Formula (I)

In formula (I), $V_0$ represents —COO—, —OCO—, —$CH_2$OCO—, —$CH_2$COO—, —O—, —$SO_2$—, —CO—, —CONHCOO—, —CONHCONH—, —CONHSO$_2$—, —CON($X^3$)—, —SO$_2$N($X^3$)— or —$C_6H_4$— ($X^3$ represents a hydrogen atom or a hydrocarbon group). $c^1$ and $c^2$ each independently represents a hydrogen atom, halogen atom, cyano group, hydrocarbon group, —COOZ', or —COOZ' by way of a hydrocarbon, $c^1$ and $c^2$ may be identical with or different from each other, and Z' represents a hydrogen atom or a hydrocarbon group which may be substituted.

Specific examples of the polymerizable double bond group represented by formula (I) are shown below. However, they are not limitative in the invention.

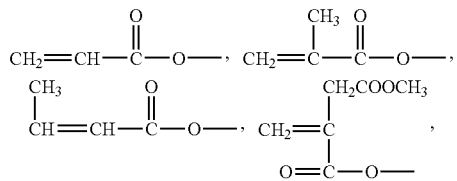

-continued

The weight average molecular weight of the alkali soluble resin in the invention is preferably from 3,000 to 30,000, further preferably, from 5,000 to 100,000 and particularly preferably, from 10,000 to 80,000.

The content of the alkali soluble resin in the invention is preferably from 0.5 to 15% by mass and, more preferably, from 1.0 to 12% by mass. In a case where the content is less than 0.5% by mass, progress of development is decelerated, which may lead to increase of the production cost. In a case where it is more than 15% by mass, favorable pattern profile can not sometimes be obtained.

[Polymerizable Monomer]

The photo-curable composition according to the invention contains at least one polymerizable monomer. The polymerizable monomer is preferably a compound having at least one addition polylymerizable ethylenically unsaturated group and having a boiling point of 100° C. or higher under a normal pressure. Examples of the compound can include monofunctional acrylates or methacrylates such as polyethylene glycol mono(meth)acrylate, polypropylene glycol mono(meth) acrylate, and phenoxyethyl(meth)acrylate; and polyfunctional acrylates and methacrylates formed by adding ethylene oxide or propylene oxide to a polyfunctional alcohol such as polyethylene glycol di(meth)acrylate, trimethylol ethane tri (meth)acrylate, neopentyl glycol di(meth)acrylate, pentaerythritol tri(meth)acrylate, pentaerythritol tetra(meth) acrylate, dipentaerythritol penta(meth)acrylate, dipentaerythritol hexa(meth)acrylate, hexandiol(meth)acrylate, trimethylol propane tri(acryloyloxypropyl)ether, tri(acryloyloxyethyl)isocyanurate, and polyfunctional alcohol such as glycerin and trimethylol ethane and then methacrylating the same, urethane acrylates as described in JP-B Nos. 48-41708 and 50-6034, and JP-A No. 51-37193, polyester acrylates described in JP-A No. 48-64183, JP-B Nos. 49-43191 and 52-30490, and epoxyacrylates as reaction products of an epoxy resin and (meth)acrylic acid, and mixtures thereof. Further, they include those introduced as photo-curable monomers and oligomer in Japan Adhesive Society Bulletin Vol. 20, No. 7, pages 300 to 308.

The content of the polymerizable monomer in the photo-curable composition according to the invention is preferably from 0.1 to 90% by mass, more preferably, from 1.0 to 80% by mass and, particularly preferably, from 2.0 to 70% by mass, based on the solid content of the composition.

[Photo Initiator]

The photo-curable composition according to the invention contains at least one photo initiator. The photo initiator is not particularly restricted so long as it can polymerize the polymerizable monomer and the alkali soluble resin in a case where it has a polymerizable double bond in the molecule, and it is desirably selected with a view point of polymerization characteristic, initiating efficiency, absorption wavelength, availability and cost.

It can be constituted preferably by using at least one compound selected from the group consisting of halomethyl triazine compounds, oxime compounds and α-aminoketone compounds.

The halomethyl-s-triazine compounds include, for example, vinyl-halomethyl-s-triadine compound as described in JP-B No. 59-1281, and 2-(naphtha-1-yl)-4,6-bis-halomethyl-s-triadine compound and 4-(p-aminophenyl)-2, 6-di-halomethyl-s-triadine compound as described in JP-A No. 53-133428.

In addition, commercially available products include, for example, TAZ series manufactured by Midori Chemical Co. Ltd. (for example, TAZ-107, TAZ-110, TAZ-104, TAZ-109, TAZ-140, TAZ-204, TAZ-113, and TAZ-123).

The oxime compounds are not particularly restricted, and include, for example, 2-(o-benzoyloxime)-1-[4-(phenylthio) phenyl]-1,2-octanedion e, 1-(4-methylsulfanyl-phenyl)-butane-1,2-butane 2-oxime-o-acetate, 1-(4-methylsulfanyl-phenyl)-butane-1-onoxime-o-acetate, hydroxyimino-(4-methylsulfanyl-phenyl)-ethyl acetate-o-acetate and hydroxyimino-(4-methylsulfanyl-phenyl)-ethyl acetate-o-benzoate.

The α-aminoketone compounds can include IRGACURE series manufactured by Ciba Specialty Chemicals Co., for example, IRGACURE 907, IRGACURE 369), 2-methyl-1-phenyl-2-morpholino propane-1-on, 2-methyl-1-[4-(hexyl) phenyl]-2-morpholino propane-1-on, 2-ethyl-2-dimethylamino-1-(4-morpholinophenyl)-butanone-1.

The photo initiator can be used together with a sensitizer or a light stabilizer.

Specific examples include benzoin, benzoinmethylether, 9-fluorenone, 2-chloro-9-fluorenone, 2-methyl-9-fluorenone, 9-anthorone, 2-bromo-9-anthorone, 2-ethyl-9-anthorone, 9,10-anthraqinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-methoxyxanthone, thioxanthone, 2,4-diethylthioxanthone, acrydone, 10-butyl-2-chloroacrydone, benzyl, dibenzalacetone, p-(dimethylamino)phenylstyrylketone, p-(dimethylamino) phenyl-p-methylstyrylketone, benzophenone, p-(dimethylamino)benzophenone (or Michler's ketone), p-(diethylamino)benzophenone and benzoanthron, and benzothiazole series compounds as described in JP-B No. 51-48516, Tinuvin 1130 and 400.

In addition to the photo initiator described above, other known photo initiator to be described below can be used. Specific examples thereof can include vicinal polyketaldonyl compounds as described in U.S. Pat. No. 2,367,660, α-carbonyl compounds as described in U.S. Pat. Nos. 2,367,661 and 2,367,670, acyloin ethers as described in U.S. Pat. No. 2,448,828, aromatic acyloin compounds substituted with α-hydrocarbon as described in U.S. Pat. No. 2,722,512, polynuclear quinone compounds as described in U.S. Pat. Nos. 3,046,127 and 2,951,758, a combination of triallylimidazol dimeter/p-aminophenylketone as described in U.S. Pat. No. 3,549,367, benzothiazole series compounds/trihalomethyl-s-triazine series compounds as described in JP-B No. 51-48516.

They include, in addition to those description above, at least one active halogen compound selected from active halogen compounds such as halomethyloxadiazole, 3-aryl-substituted coumarine compounds, lophine dimers, benzophenone compounds, acetophenone compounds and derivatives thereof, cyclopentadiene-benzene-iron complex and salts thereof.

Examples of the active halogen compounds such as halomethyloxadiazole include 2-halomethyl-5-vinyl-1,3,4-oxadiazole compounds as described in JP-B No. 57-6096, 2-trichloromethyl-5-styryl-1,3,4-oxadiazole, 2-trichloromethyl-5-(p-cyanosryryl)-1,3,4-oxadiazole, 2-trichloromethyl-5-(p-methoxystyryl)-1,3,4-oxadiazole.

In addition, T-series manufactured by PANCHIM Co. Ltd. (for example, T-OMS, T-BMP, T-R, T-B, etc.), IRGACURE series manufactured by Ciba Specialty Chemicals Co. Ltd. (for example, IRGACURE 651, IRGACURE 184, IRGACURE 500, IRGACURE 1000, IRGACURE 149, IRGACURE 819, IRGACURE 261, etc.), DAROCURE series (for example, DAROCURE 1173) are also effective. In addition, 4,4-bis(diethylamino)-benzophenone, 2-(o-benzoyloxime-1-[4-(phenylthio)phenyl]-1,2-octanedione, 2-benzyl-2-dimethylamino-4-morpholinobutylophenone, 2,2-dimethoxy-2-phenylacetophenone, 2-(o-chlorphenyl)-4,5-diphenylimidazoryl dimer, 2-(o-fluorophenyl)-4,5-diphenyl imidazoryl dimer, 2-(o-methoxyphenyl)-4,5-diphenyl imidazoryl dimer, 2-(p-methoxyphenyl)-4,5-diphenyl imidazoryl dimer, 2-(p-dimethoxyphenyl)-4,5-diphenylimidazoryl dimer, 2-(2,4-dimethoxyphenyl)-4,5-diphenyl imidazoryl dimer, 2-(p-methylcarcaptophenyl)-4,5-diphenyl imidazoryl dimer, benzoin isopropyl ether are also used effectively.

In the invention, a photo initiator having the maximum absorption in an ultraviolet ray wavelength region (ultraviolet region) can also be used in combination.

Particularly in this case, irradiation upon Post-curing can be conducted suitably by using a light at a wavelength in an ultraviolet region. When using a light in a wavelength region of ultraviolet radiation, the Post-curing can be completed in a short period of time, and even when conducting post-baking thereafter, deformation caused by thermal flow or tailing tending to be caused in a pixel mainly containing a dye can be prevented effectively, so that pixels of a rectangular shape and having a favorable pattern profile can be obtained.

It can be constituted suitably by using two or more photo initiators containing at least one photo initiator having the maximum absorption wavelength in an ultraviolet region of 300 nm or less and at least one photo initiator having the maximum absorption wavelength in a wavelength region of more than 300 nm (for example, from 310 to 420 nm) as a specific example. In this case, pattern exposure can be conducted by a light at a wavelength of more than 300 nm (particularly from 310 to 420 nm) and Post-curing can be conducted by a light at a short wavelength of 300 nm or less, by containing not merely two kinds of photo initiators, but a photo initiator having the maximum absorption wavelength of 300 nm or more and a photo initiator having the maximum absorption wavelength of 300 or less in combination.

With the constitution described above, the photo initiator having the maximum absorption wavelength in a wavelength region of 300 nm (for example, from 310 to 420 nm) can be selected from the photo initiators described above. Further, the photo initiator having the maximum absorption wavelength in an ultraviolet ray region of 300 nm or less can include, for example, carbonyl compounds such as Epacure TZT (manufactured by Fratelli Lambert Co. Ltd.), Kayacure BTC, Kayacure ITX (manufactured by Nippon Kayaku Co. Ltd), dicarbonyl compounds such as Vicure 55 (manufacture by Stauffer AKZO Co. Ltd), acetophenone compounds such as Esacure KIP 100F, Esacure KT37 (manufactured by Siebel Hegner Co. Ltd.), and FIRST DEAP (manufactured by FIRST CHEMICAL Co. Ltd.), benzoin ether compounds such as BENZOIN B, BENZOIN PS-8A (manufactured by Wako Pure Chemical Industries, Ltd., aminocarbonyl compounds such as Kayacure EPA, Kayacure DMBI (manufactured by Nippon Kayaku Co. Ltd.), and halogen compounds such as Triazine A, Triazine PP, and Triazine B (manufactured by Panthim Co. Ltd.)

The content of the photo initiator in the photo-curable composition according to the invention is preferably from 0.01 to 50% by mass, more preferably, from 1 to 30% by mass and, particularly preferably, from 1 to 20% by mass based on the total solid content of the alkali soluble resin in a case of containing the polymerizable monomer and a molecular chain having a polymerizable double bond in the molecule. In a case where the content is less than 0.01% by mass, the polymerization reaction sometimes less proceeds, and in a case where it is more than 50% by mass, the degree of polymerization becomes greater, however, the molecular weight is decreased to result in week film strength.

It is preferred to further add a heat polymerization inhibitor to the photo-curable composition according to the invention in addition to those described above. For example, hydroquinone, p-methoxyphenol, di-t-butyl-p-cresol, pyrogallol, t-butyl catechol, benzoquinone, 4,4'-thiobis(3-methyl-6-t-butylphenyl), 2,2'-methylene bis (4-methyl-6-t-butylphenol), or 2-mercapto benzoimidazole is useful.

[Solvent]

The photo-curable composition according to the invention can generally be constituted by further using a solvent if required. The solvent is not restricted so long as it satisfies solubilizability for various kinds of components already described and coating property when it is formed into a composition, however, it is preferably selected while taking solubilizability of a dye or an alkali soluble resin, coating property and safety into consideration.

Examples of the solvent can include esters, for example, ethyl acetate, n-butyl acetate, isobutyl succinate, amyl formate, isoamyl acetate, isobutyl acetate, butyl propionate, isopropyl butyrate, ethyl butyrate, butyl butylate, alkyl esters, methyl lactate, ethyl lactate, oxymethyl acetate, oxyethyl acetate, oxybutyl acetate, methoxy methyl acetate, methoxy ethyl acetate, methoxy butyl acetate, ethoxy methyl acetate, or ethoxy ethyl;

alkyl 3-oxypropionate esters such as methyl 3-oxypropionate, ethyl 3-oxypropionate, for example, methyl 3-methoxypropionate, ethyl 3-methoxypropionate, methyl 3-ethoxypropionate, and ethyl 3-ethoxypropionate; and alkyl 2-oxypropyolate ester such as methyl 2-oxypropionate, ethyl 2-oxypropionate, propyl 2-oxypropionate, for example, methyl 2-methoxypropionate, ethyl 2-methoxypropionate, propyl 2-methoxypropionate, methyl 2-ethoxyproionate, ethyl 2-ethoxypropionate, methyl 2-oxy-2-methylpropionate, ethyl 2-oxy-2-methyl propionate, methyl 2-methoxy-2-methyl propionate, ethyl 2-ethoxy-2-methyl propionate, methyl pyruvate, ethyl pyruvate, propyl pyruvate, methyl acetoacetate, ethyl acetoacetate, methyl 2-oxobutanate, and ethyl 2-oxobutanate;

ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether, propylene glycol methylether acetate, propylene glycol ethylether acetate, and propylene glycol propyl ether acetate; and ketone, for example, methylkethyl ketone, cyclohexanone, 2-heptanone, and 3-heptanone; or aromatic hydrocarbons, for example, toluene and, xylene.

Among the solvents described above, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butyl carbitol acetate, propylene glycol methyl ether, propylene glycol methyl ether acetate are more preferred.

[Other Component]

In the photo-curable composition according to the invention, various additives, for example, fillers, polymeric compounds other than those described above, surfactants, adhesion enhancing agent, antioxidants, ultraviolet absorbing agent and untiflocculants can be added.

Specific examples of the additives can include fillers such as glass and alumina; polymeric compounds other than binder resins, such as polyvinyl alcohol, polyacrylic acid, polyethylene glycol monoalkyl ether, and polyfluoroalkyl acrylate; surfactants such as nonionic, cathionic and anionic types; adhesion enhancing agent such as vinyl trimethoxysilane, vinyl triethoxy silane, vinyl tris(2-methoxyethoxy)silane, N-(2-aminoethyl)-3-aminopropyl methyldimetoxy silane, N-(2-aminoethyl)-3-aminopropyl trimethoxy silane, 3-aminopropyl triethoxy silane, 3-glysidoxy propyl trimethoxy silane, 3-glycidoxy propyl trimetoxy silane, 2-(3,4-epoxy cyclohexyl) ethyl trimethoxy silane, 3-chloropropyl methyl dimethoxy silane, 3-chloropropyl trimethoxy silane, 3-methacryloxy propyl trimethoxy silane, 3-mercapto propyl trimethoxy silane; antioxidants such as 2,2-thiobis(4-methyl-6-t-butylphenyl), 2,6-t-butylphenol; and ultraviolet absorbing agent absorber such as 2-(3-t-butyl-5-methyl-2-hydroxyphenyl)-5-chlorobenzotriazo le, alkoxybenzophenone; and untiflocculants such as sodium polyacrylate.

Further in a case of promoting an alkali solubility of a non-cured portion in order to further improve the developability of the photo-curable composition, an organic carboxylic acid, preferably, a low molecular weight organic carboxylic acid having a molecular weight of 1000 or less can further be added to the photo-curable composition. Specific examples can include an aliphatic monocarboxylic acid such as formic acid, acetic acid, propionic acid, butyric acid, valeric acid, pivalic acid, caproic acid, diethyl acetic acid, enanthic acid, caprylic acid, etc.; an aliphatic dicarboxylic acid such as oxalic acid, malonic acid, succinic acid, glutaric acid, adipic acid, pimelic acid, subelic acid, azelaic acid, sebacic acid, brassilic acid, methyl malonic acid, ethyl malonic acid, dimethyl malonic acid, methyl succinic acid, tetramethyl succinic acid, and citraconic acid; an aliphatic tricarboxylic acid such as tricarballilic acid, aconitic acid and camphoronic acid; an aromatic monocarboxylic acid such as benzoic acid, toluic acid, cumic acid, hemellitic acid, mesitylenic acid, etc; aromatic polycarboxylic acid such as phthalic acid, isophthalic acid, terephthalic acid, trimellitic acid, trimesic acid, mellophanic acid, and pyromellitic acid; other carboxylic acid such as phenyl acetic acid, hydratropic acid, hydrosinnamic acid, mandelic acid, phenyl succinic acid, atropic acid, sinnamic acid, methyl sinnamate, benzyl sinnamate, cinnamylidene acetic acid, coumaric acid, and umbellic acid.

The color filter for an image sensor obtained by the method of manufacturing a color filter for an image sensor according to the invention is suitable to an image sensor such as for CCD, especially, for a CCD element and a CMOS element of high resolution power exceeding 1,000,000 pigments. The color filter for an image sensor can be used as a color filter to be arranged between a light receiving portion of each pixel constituting, for example, a CCD and a microlens for collecting light.

Example 1

The invention is to be described more specifically below. However, the invention is not restricted to the examples described below unless they exceed the gist of the invention. Incidentally, "parts" is based on mass unless otherwise specified.

<Formation of Yellow Pixels>

1) Preparation of Photo-Curable Composition Y

The composition described below was mixed and dissolved to prepare a photo-curable composition Y.

(Composition)

| | |
|---|---|
| ethyl lactate (solvent) | 734 parts |
| the following copolymer 1 | 116 parts |
| (average mass molecular weight Mw = 20,000, acid value 30; alkali soluble resin) | |
| dipentaerythritol hexaacrylate | 80 parts |
| (polymerizable monomer: manufactured by Nippon Kayaku (Co.) | |
| CGI-124 | 20 parts |
| (o-acyloxime-based photo initiator; manufactured by Ciba Specialty Chemicals Co. Ltd.) | |
| Valifast Yellow 1101 | 50 parts |
| (dye; manufactured by Orient Chemical Industry Co. Ltd.) | |

Copolymer 1

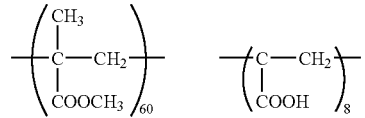

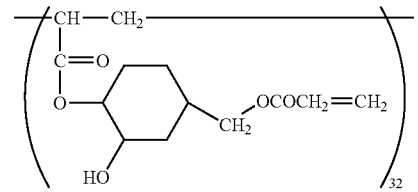

2) Preparation of a Silicon Wafer Substrate with Undercoat Layer

A 6-inch silicon wafer was heat treated in an oven at 200° C. for 30 minute or more. Then, an undercoating resin CT 2000L (manufactured by Fuji Film Arch Co. Ltd.) was coated on the silicon wafer so as to have a dry film thickness of 2 μm, and further dried under heating in an oven at 220° C. for 1 hour to obtain a silicon wafer substrate with an undercoat layer.

3) Exposure and Development of Coating Film

A photo-curable composition Y prepared in 1) described above was coated on the undercoat layer of the silicon wafer substrate with the undercoat layer obtained in 2) described above, to form a photo-curable coating film. Then, the coating film was heat treated using a hot plate at 100° C. for 120 seconds (pre-baking) so as to have a dry film thickness of 1 μm.

Following this, the thus formed coating film was irradiated by using an i-ray stepper-aligner FPA-3000 i 5+ (manufactured by Canon Co.) at a wavelength of 365 nm through an Island pattern mask for the color yellow with a 2 μm square pattern at an exposure dose of from 40 to 520 mJ/cm². Then, the silicon wafer substrate with an irradiated coating film formed thereon was placed on a horizontal rotary table of a spin-shower developing machine (model DW-30; manufactured by Chemitronics Co.) and put through paddle development at 23° C. for 60 seconds using a liquid developer formed by diluting CD-2000 (manufactured by Fuji Film Arch Co.) to a concentration of 60% by mass, to form a Yellow pattern on the silicon wafer substrate.

The silicon wafer substrate formed with the Yellow pattern was fixed to the horizontal rotary table with a vacuum chuck system. While rotating the silicon wafer substrate with a rotational device at a rotation speed of 50 rpm, a rinsing treatment was conducted by supplying purified water in shower form from above the rotational center thereof from a jetting nozzle, after which spray-drying was applied.

4) Post-Curing and Post-Baking

Having been dried, the silicon wafer substrate was placed on a temperature variable hot plate such that the wafer substrate was in contact therewith, and ultraviolet radiation was irradiated on the Yellow pattern formed on the silicone wafer substrate using an UV curing apparatus (high pressure mercury lamp; trade name: AEW-612A, manufactured by Dai Nippon Screen Co.) (Post-curing). The temperature for the hot plate and the irradiation time for the ultraviolet radiation in this case are as described in "condition 1" shown in the following Table 1. Following this, as shown by "condition 1" the following Table 1, it was post-baked by further heating for 5 minutes on the hot plate with the temperature regulated to 20° C. In this manner, Yellow pixels (Y pixels) were formed.

5) Evaluation

The Yellow pixels formed as described above were measured and evaluated as described below. Table 2 shows the results of the measurement and the evaluation.

—Evaluation of Pattern Profile—

The width of the pixel patterns before post-baking was measured during the process for forming the Yellow pixels with a critical dimension measurement SEM (S-7800H, manufactured by Hitachi Ltd.) and a pattern of the same 2 μm width as the pattern mask width was selected. Then, for the selected pattern, a specimen was prepared by dividing the Yellow pattern after development (before Post-curing) and after post-baking such that the cross section of each pattern could be observed, and the shapes were observed and photographed using an SEM (S-7800H, manufactured by Hitachi Ltd.).

Then, based on the SEM photographs taken for the pattern cross sections, the thickness A for the patterns and the length B from the end of the flat surface in the upper portion to the skirt or bottom end of the patterns (refer to FIG. 1) were measured, and the ratio B/A was determined by dividing the length B with the thickness A, which was used as an index for evaluation of the pattern profiles. As the ratio B/A becomes smaller, it shows that a pattern profile has a better rectangular shape, and particularly, the ratio is 1 when a pattern profile forms an ideal rectangular shape.

—Evaluation of Solvent Resistance—

The change in chromaticity, i.e., color difference (ΔEab value), of the formed Yellow pixels before and after dipping in ethyl acetate (EL) at room temperature for 30 minutes was measured using a chromaticity meter (MCPD-1000, manufactured by Otsuka Denshi Co.), and the value ΔEab was used as an index showing the degree of solvent resistance. A smaller ΔEab value shows better solvent resistance. Further, as a guideline for preventing color mixing, particularly when coating second and subsequent colors, a smaller value is desired for the color difference ΔEab.

<Formation of Red Pixels>

Then, Red pixels (R pixels) were formed on the silicone wafer substrate in a region where the Y pixels were not formed in the same manner as in "Formation of Yellow pixels" described above except that a photo-curable composition R was prepared having the dye in the composition for the photo-curable composition Y used for the formation of the Yellow pixels replaced with Valifast Red 3304 (dye; manufactured by Orient Chemical Industry Co.). And Identical measurement and evaluation were then conducted. During i-ray irradiation, an Island pattern mask for the colored with a 2 μm square pattern was used. The results of the measurement and evaluation are shown in the following Table 2.

<Formation of Blue Pixels>

Then, blue pixels (B pixels) were formed on the silicon wafer substrate in a region where the Y pixels and the R pixels were not formed in the same manner as in "formation of Yellow pixels" described above except that a photo-curable composition B was prepared having the dye in the composition for the photo-curable composition Y used for the formation of the Yellow pixels replaced with Valifast Blue 2620 (dye; manufactured by Orient Chemical Industry Co.) and having the alkali-soluble replaced resin with a solution of benzyl methacrylate/methacrylic acid copolymer in a propylene glycol monomethyl ether acetate (copolymerization ratio (molar ratio)=70/30, at a solid content of 45%, a weight-average molecular weight of 5000; alkali soluble resin). Identical measurement and evaluation were then conducted. Further, during irradiation of i-radiation, an Island pattern mask for the color blue with a 2 μm square pattern was used. The results of the measurement and evaluation are shown in the following Table 2.

A color filter for use in a three color image sensor was thus manufactured as described above.

[Table 1]

<Conditions of Post-Curing and Post-Baking>

| | Post-curing | | Post-baking | |
|---|---|---|---|---|
| | Irradiation time [sec] | Plate temperature [° C.] | Plate tempreture [° C.] | Heating time [min] |
| Condition 1 | 60 | 50 | 200 | 5 |
| Condition 2 | 60 | 50 | None | |
| Condition 3 | 15 | 50 | 200 | 5 |
| Condition 4 | 15 | 50 | None | |
| Condition 5 | 60 | — | None | |
| Condition 6 | 60 | 25 | None | |
| Condition 7 | 60 | 70 | None | |
| Condition 8 | None | | 200 | 5 |

Example 2

In "4) Post-curing and post-baking" of Example 1, Y pixel, R pixels and B pixels were formed successively in the same manner as in Example 1 except that the condition was changed for the Post-curing and the post-baking in the formation of the B pixels (refer to Table 1) from "condition 1" to "condition 2" as shown in the following Table 2. Identical measurement and evaluation were then conducted. The results of the measurement and evaluation are shown in the following Table 2.

Example 3

In "4) Post-curing and post-baking" of Example 1, Y pixels, R pixels and B pixels were formed successively in the same manner as in Example 1 except that the condition was changed for the Post-curing and the post-baking in the formation of the B pixels (refer to Table 1) from "condition 1" to "condition 3" as shown in the following Table 2. Identical measurement and evaluation were the conducted. The results of the measurement and evaluation are shown in the following Table 2.

Example 4

Y pixels, R pixels, and B pixels were formed successively in the same manner as in Example 1 except the solution of benzyl methacrylate/methacrylic acid copolymer in propylene glycol monomethyl ether acetate in the (composition) of the photo-curable composition B in Example 1 was replaced with the copolymer 1 described above. Identical measurement and evaluation were then conducted. The results of the measurement and evaluation are shown in the following Table 2.

Example 5

Y pixels, R pixels, and B pixels were formed successively in the same manner as in Example 3 except that the solution of benzyl methacrylate/methacrylic acid copolymer in propylene glycol monomethyl ether acetate in the (composition) of the photo-curable composition B in Example 3 was replaced with the copolymer 1 described above. Identical measurement and evaluation were then conducted. The results of the measurement and evaluation are shown in the following Table 2.

Example 6

Y pixels, R pixels, and B pixels were formed successively in the same manner as in Example 1 except that the solution of benzyl methacrylate/methacrylic acid copolymer in propylene glycol monomethyl ether acetate in the (composition) of the photo-curable composition B in Example 1 with the copolymer 1 described above, and further, the condition was changed for the Post-curing and the post-baking in the formation of B pixels in "4) Post-curing and post-baking" (refer to Table 1) from "condition 1" to "condition 4" as shown in the following table 2. The results of measurement and evaluation are shown in the following the table 2.

Example 7

Y pixels, R pixels and B pixels were formed successively in the same manner as in Example 1 except that the solution of benzyl methacrylate/methacrylic acid copolymer in propylene glycol menomethyl ether acetate in the (composition) of the photo-curable composition B was replaced with the copolymer 1 described above, and further, the condition was changed for Post-curing and post-baking in the formation of the Y pixels and the formation of the B pixels (refer to table 1) in "4) Post-curing and post-baking", respectively from "condition 1" to "condition 5" as shown in the following table 2. Identical measurement and evaluation were then conducted. Results of the measurement and evaluation are shown in the following Table 2.

Example 8

Y pixels, R pixels, and B pixels were formed successively in the same manner as in Example 1 except that the solution of benzyl methacrylate/methacrylic acid copolymer in propylene glycol menomethyl ether acetate in the (composition) of the photo-curable composition B was replaced with the copolymer 2 described below (mass average molecular weight Mw=30,000; alkali soluble resin), and further, the condition was changed for Post-curing and post-baking in the formation of the Y pixels and the formation of the B pixels (refer to Table 1) in "4) Post-curing and post-baking", respectively from "condition 1" to "condition 6" as shown in the following Table 2. Identical measurement and evaluation were conducted. Results of the measurement and evaluation are shown in the following Table 2.

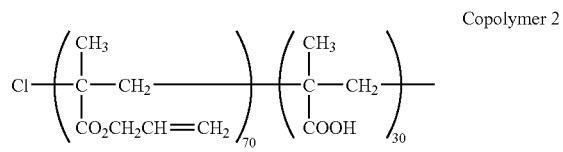

Copolymer 2

Comparative Example 1

In the "Formation of Blue pixels" in Example 1, Y pixels, R pixels, and B pixels were formed successively in the same manner as in Example 1 that the B pixels ware formed by conducting post-baking directly after spray-drying without conducting Post-curing in "4) Post-curing and post-baking". Identical measurement and evaluation were then conducted. Results of the measurement and evaluation are shown in the following Table 2.

Comparative Example 2

In the "Formation of Blue pixels" in Example 4, Y pixels, R pixels, and B pixels were formed successively in the same manner as in Example 4 except that the B pixels were formed by conducting post-baking directly after spray-drying without conducting Post-curing in "4) Post-curing and post-baking" Identical measurement and evaluation were then conducted. Results of the measurement and evaluation are shown in the following Table 2.

Comparative Example 3

In the "Formation of Yellow pixels" in Example 1, Y pixels, R pixels, and B pixels were formed successively in the same manner as in Example 1 except that the Y pixels were formed by conducting post-baking directly after spray-drying without conducting Post-curing in "4) Post-curing and post-baking". Identical measurement and evaluation were then conducted. Results of the measurement and evaluation are shown in the following Table 2.

Comparative Example 4

In the "Formation of Red pixels" in example 1, Y pixels, R pixels, and B pixels were formed successively in the same manner as in Example 1 except that the R pixels were formed by conducting post-baking directly after spray-drying without conducting Post-curing in "4) Post-curing and post-baking". Identical measurement and evaluation were then conducted. Results of the measurement and evaluation are shown in the following Table 2.

Comparative Example 5

Y pixels, R pixels, and B pixels were formed successively in the same manner as in Example 1 except that the solution of benzyl methacrylate/methacrylic acid copolymer in propylene glycol monoethyl ether acetate in the (composition) of the photo-curable composition B in Example 1 was replaced with the copolymer 1 described above, and further, each of the conditions was changed for Post-curing and post-baking in the formation of Y pixels and the formation of B pixels in "4) Post-curing and post-baking" (refer to Table 1) from "condition 1" to "condition 6" and "condition 7", respectively, as shown in the following Table 2, Identical measurement and evaluation were then conducted. The results of the measurement and evaluation are shown in the following Table 2.

with comparative examples where Post-curing was not conducted. However, even when Post-curing, when the temperature was a high temperature above 50° C. (Comparative Example 5), although the hue was excellent, it was difficult to effectively suppress shape deformation that accompanies thermal flow and the like caused by post-baking, and the pixel pattern could not be formed into a rectangular shape that would be is suitable for use with an image sensor.

Further, in view of the results of Examples 1 and 3, longer irradiation time (60 sec) during post-curing was more satisfactory.

TABLE 2

| | Conditions of Post-curing/post-baking | | | | B/A | | |
|---|---|---|---|---|---|---|---|
| | Blue | Yellow | Red | | After development (before post-curing) | After post-curing/ post-baking | Difference of color Δ Eab |
| Example 1 | Condition 1 | Condition 1 | Condition 1 | Blue | 1.14 | 1.24 | 1.67 |
| | | | | Yellow | 1.14 | 1.16 | — |
| | | | | Red | 1.09 | 1.16 | |
| Example 2 | Condition 2 | Condition 1 | Condition 1 | Blue | 1.14 | 1.15 | 1.82 |
| | | | | Yellow | 1.14 | 1.16 | — |
| | | | | Red | 1.09 | 1.16 | |
| Example 3 | Condition 3 | Condition 1 | Condition 1 | Blue | 1.14 | 1.56 | 5.91 |
| | | | | Yellow | 1.14 | 1.16 | — |
| | | | | Red | 1.09 | 1.16 | |
| Example 4 | Condition 1 | Condition 1 | Condition 1 | Blue | 1.12 | 1.06 | 1.29 |
| | | | | Yellow | 1.14 | 1.16 | — |
| | | | | Red | 1.09 | 1.16 | |
| Example 5 | Condition 3 | Condition 1 | Condition 1 | Blue | 1.12 | 1.12 | 3.59 |
| | | | | Yellow | 1.14 | 1.16 | — |
| | | | | Red | 1.09 | 1.16 | |
| Example 6 | Condition 4 | Condition 1 | Condition 1 | Blue | 1.12 | 1.05 | 8.57 |
| | | | | Yellow | 1.14 | 1.16 | — |
| | | | | Red | 1.09 | 1.16 | |
| Example 7 | Condition 5 | Condition 5 | Condition 1 | Blue | 1.12 | 1.09 | 3.63 |
| | | | | Yellow | 1.14 | 1.10 | — |
| | | | | Red | 1.09 | 1.16 | |
| Example 8 | Condition 6 | Condition 6 | Condition 1 | Blue | 1.15 | 1.15 | 3.42 |
| | | | | Yellow | 1.14 | 1.10 | — |
| | | | | Red | 1.09 | 1.16 | |
| Comp. Example 1 | Condition 8 | Condition 1 | Condition 1 | Blue | 1.14 | 2.18 | 44.49 |
| | | | | Yellow | 1.14 | 1.16 | — |
| | | | | Red | 1.09 | 1.16 | |
| Comp. Example 2 | Condition 8 | Condition 1 | Condition 1 | Blue | 1.12 | >3.00 | 41.62 |
| | | | | Yellow | 1.14 | 1.16 | — |
| | | | | Red | 1.09 | 1.16 | |
| Comp. Example 3 | Condition 1 | Condition 8 | Condition 1 | Blue | 1.14 | 1.24 | 1.67 |
| | | | | Yellow | 1.14 | 1.50 | — |
| | | | | Red | 1.09 | 1.16 | |
| Comp. Example 4 | Condition 1 | Condition 1 | Condition 8 | Blue | 1.14 | 1.24 | 1.67 |
| | | | | Yellow | 1.14 | 1.16 | — |
| | | | | Red | 1.09 | 1.33 | |
| Comp. Example 5 | Condition 7 | Condition 6 | Condition 1 | Blue | 1.12 | 2.36 | 1.15 |
| | | | | Yellow | 1.14 | 1.10 | — |
| | | | | Red | 1.09 | 1.16 | |

As shown in Table 2 above, in the examples where Post-curing was carried out for the patterns comprising the dye-containing photo-curable compositions, pixels having a substantially rectangular shape and a more favorable pattern profile were obtained, and the pixels showed less color mixing and exhibited excellent hues compared with comparative examples where Post-curing was not conducted. Post-curing was effective also in the systems using an alkali soluble resins not having a double bond (Examples 1 to 3) and, particularly, was effective in the systems where the alkali soluble resin had double bonds (Examples 4 to 8).

Further, in the examples, shape deformation that accompanies thermal flow and the like produced, etc. by the subsequent post-baking was suppressed effectively, and the pattern profile after post-baking were also satisfactory compared

The invention claimed is:

1. A method for producing a color filter for an image sensor comprising:
    coating a photo-curable composition containing a dye, an alkali soluble resin, a polymerizable monomer and a photo initiator on a substrate directly or with another layer therebetween and then drying the same to form a coating film,
    exposing a predetermined pattern on the coating film,
    developing the exposed coating film with a liquid alkali developer, and
    irradiating the developed coating film with ultraviolet radiation while heating at a temperature of 20° C. to 50° C.,
    wherein the alkali soluble resin contains a molecular chain having a polymerizable double bond in the molecule, wherein, during irradiating with ultraviolet radiation, ultraviolet radiation is irradiated on the developed coating film under heating at 25° C. to 40° C.

2. A method for producing the color filter for an image sensor according to claim 1, further comprising heating the coating film which has been irradiated with ultraviolet radiation at 100° C. to 300° C.

3. A method for producing the color filter for an image sensor according to claim 1 or 2, wherein a pixel pattern having a thickness of 3 μm or less and a pixel size of 5 μm or less is formed.

4. A method for producing the color filter for an image sensor according to claim 1, wherein, during irradiating with ultraviolet radiation, the wavelength of the ultraviolet radiation is from 200 to 300 nm.

5. A method for producing the color filter for an image sensor according to claim 1, wherein, during irradiating with ultraviolet radiation, the irradiation time of the ultraviolet radiation is from 10 to 180 sec.

6. A method for producing the color filter for an image sensor according to claim 1, wherein the molecular chain is present on a side chain and the molecular chain has at least one member selected from the group consisting of an acryloyl group, a methacryloyl group, and an allyl group.

7. A method for producing a color filter for an image sensor according to claim 1, wherein the alkali soluble resin contains at least one of the (meth) acryloyl groups represented by the following formula (1-1) to formula (1-3):

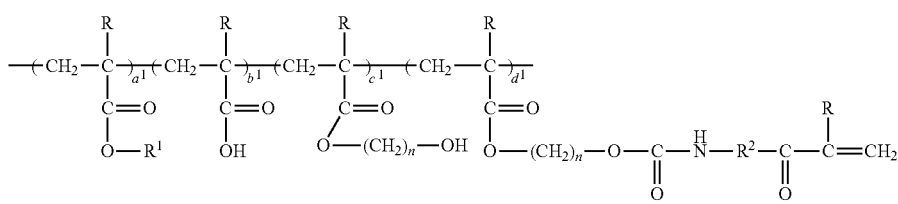

Formula (1-1)

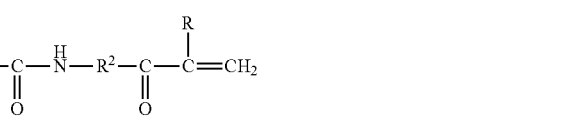

Formula (1-2)

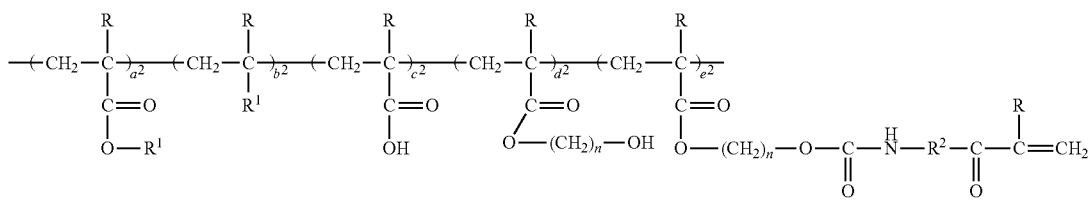

Formula (1-3)

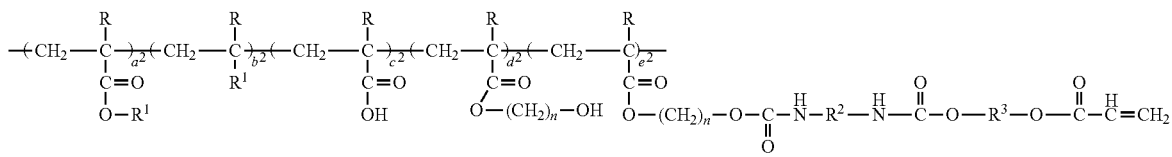

wherein R represents a hydrogen atom or a methyl group, $R^1$ represents an alkyl group having 1 to 18 carbon atoms, a phenyl group having an alkyl group having 1 to 4 carbon atoms or an alkoxy group having 1 to 4 carbon atoms, an aryl group having 6 to 12 carbon atoms, or an aralkyl group having 7 to 12 carbon atoms, $R^2$ represents an alkylene group having 1 to 18 carbon atoms, a phenylcarbamate ester group having an alkyl group having 1 to 4 carbon atoms, or a carbamate ester group having a cycloaliphatic group having 3 to 18 carbon atoms, $R^3$ represents a linear or branched alkylene group having 2 to 16 carbon atoms; $a^1$ to $d^1$ in formula (1-1), $a^2$ to $e^2$ in formula (1-2), and $a^2$ to $e^2$ in formula (1-3) each represent a molar ratio (mol %) of repetitive units contained; $b^1$ represents from 3 to 50, $c^1$ represents from 3 to 40, $d^1$ represents from 2 to 60, and they satisfy: $a^1+b^1+c^1+d^1=100$ in formula (1-1), and $b^2$ represents from 0 to 85, $c^2$ represents from 3 to 50, $d^2$ represents from 3 to 40, $e^2$ represents from 2 to 60, and they satisfy: $a^2+b^2+c^2-d^2+e^2=100$ in formulae (1-2) and (1-3), and n represents from 2 to 16.

8. The method for producing a color filter for an image sensor according to claim 1, wherein the content of the alkali soluble resin in the photo-curable composition is from 0.5 to 15% by mass.

* * * * *